United States Patent
Chen et al.

(10) Patent No.: US 11,646,487 B2
(45) Date of Patent: *May 9, 2023

(54) DUAL-ANTENNA SYSTEM FOR A VIDEO-RECORDING DOORBELL, AND ASSOCIATED DEVICES AND SYSTEMS

(71) Applicant: Google LLC, Mountain View, CA (US)

(72) Inventors: Huanyu Chen, Freemont, CA (US); Peter Joseph Bevelacqua, Sunnyvale, CA (US); Emma Elizabeth Feshbach Bright, Palo Alto, CA (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/658,213

(22) Filed: Apr. 6, 2022

(65) Prior Publication Data

US 2022/0231409 A1    Jul. 21, 2022

Related U.S. Application Data

(63) Continuation of application No. 17/122,449, filed on Dec. 15, 2020, now Pat. No. 11,336,005.

(51) Int. Cl.
*H01Q 1/52* (2006.01)
*H01Q 21/06* (2006.01)
(Continued)

(52) U.S. Cl.
CPC ............... *H01Q 1/52* (2013.01); *H01Q 1/22* (2013.01); *H01Q 21/061* (2013.01);
(Continued)

(58) Field of Classification Search
CPC .......... H01Q 1/52; H01Q 1/22; H01Q 21/061; H04N 7/186; H05K 7/1427; G08B 3/10; H04R 1/028
See application file for complete search history.

(56) References Cited

U.S. PATENT DOCUMENTS 9,113,051 B1    8/2015  Scalisi
10,042,429 B2   8/2018  Alameh et al.
(Continued)

FOREIGN PATENT DOCUMENTS

CN     205566533     9/2016
CN     109887775     6/2019
(Continued)

OTHER PUBLICATIONS

"International Search Report and Written Opinion", Application No. PCT/US2021/044204, dated Jan. 10, 2022, 17 pages.
(Continued)

*Primary Examiner* — Jared Walker
(74) *Attorney, Agent, or Firm* — Colby Nipper PLLC

(57) ABSTRACT

This document describes a dual-antenna system for a video-recording doorbell and associated devices and systems. The described antenna system may be implemented on an elongated printed circuit board and can be used for wideband and ultra-wideband applications. For low-cost devices, the dual-antenna system may implement diversity antennas by including first and second substantially orthogonal antennas connected to a chipset configured for single-input single-output (SISO) functionality. The dual-antenna system described herein achieves high antenna isolation and efficiency without a decoupling structure between the first and second antennas. Further, the dual-antenna system achieves high isolation while in proximity to a battery (e.g., a battery within a housing of a battery-powered, video-recording doorbell) and a metal plate for mounting the device to a wall or other structure.

20 Claims, 6 Drawing Sheets

(51) Int. Cl.
*H01Q 1/22* (2006.01)
*H04N 7/18* (2006.01)
*H05K 7/14* (2006.01)
*G08B 3/10* (2006.01)
*H04R 1/02* (2006.01)

(52) U.S. Cl.
CPC ........... *H04N 7/186* (2013.01); *H05K 7/1427* (2013.01); *G08B 3/10* (2013.01); *H04R 1/028* (2013.01)

(56) References Cited

U.S. PATENT DOCUMENTS

| | | | |
|---|---|---|---|
| 11,336,005 | B1 | 5/2022 | Chen et al. |
| 11,522,284 | B2 | 12/2022 | Grillo et al. |
| 2004/0085205 | A1 | 5/2004 | Yeh |
| 2014/0086441 | A1 | 3/2014 | Zhu et al. |
| 2017/0048495 | A1 | 2/2017 | Scalisi |
| 2018/0261060 | A1 | 9/2018 | Siminoff et al. |
| 2018/0343403 | A1 | 11/2018 | Mehdi et al. |
| 2019/0075648 | A1 | 3/2019 | Nasu et al. |
| 2019/0200872 | A1 | 7/2019 | Matsuoka et al. |
| 2019/0342527 | A1 | 11/2019 | Siminoff |
| 2019/0387204 | A1 | 12/2019 | Jeong |
| 2020/0288045 | A1 | 9/2020 | Jeong et al. |
| 2020/0358908 | A1 | 11/2020 | Scalisi et al. |
| 2022/0271422 | A1 | 8/2022 | Grillo |
| 2023/0071275 | A1 | 3/2023 | Grillo |

FOREIGN PATENT DOCUMENTS

| | | |
|---|---|---|
| CN | 210271128 | 4/2020 |
| CN | 210924810 | 7/2020 |
| EP | 3445046 | 2/2019 |
| GB | 2369450 | 3/2002 |
| WO | 2017160906 | 9/2017 |
| WO | 2022072057 | 4/2022 |

OTHER PUBLICATIONS

"Invitation to Pay Additional Fees", Application No. PCT/US2021/044204, dated Nov. 10, 2021, 10 pages.

"Notice of Allowance", U.S. Appl. No. 17/122,449, dated Jan. 20, 2022, 9 pages.

Wu, et al., "Design of a Compact UWB MIMO Antenna without Decoupling Structure", Apr. 2018, 8 pages.

"Notice of Allowance", U.S. Appl. No. 17/663,177, dated Aug. 9, 2022, 10 pages.

"Foreign Office Action", TW Application No. 110136748, dated Jun. 2, 2022, 8 pages.

"Foreign Office Action", TW Application No. 110136748, dated Feb. 2, 2023, 11 pages.

DUAL-ANTENNA SYSTEM FOR A VIDEO-RECORDING DOORBELL, AND ASSOCIATED DEVICES AND SYSTEMS

CROSS-REFERENCE TO RELATED APPLICATION

The present application is a continuation of and claims priority to U.S. patent application Ser. No. 17/122,449, filed Dec. 15, 2020, the entire disclosure of which is hereby incorporated by reference.

BACKGROUND

In some electronic devices, an antenna system using multiple antennas may be implemented for wireless communication. However, isolation between the multiple antennas may be limited by the surrounding hardware of the electronic device, particularly for devices with a small form factor. Antenna isolation is a measure of a ratio between the power incident upon a first antenna and the power delivered to a second antenna. Good isolation, therefore, results in uncorrelated transmission and reception of electric signals on both antennas. Poor isolation between antennas can significantly reduce performance and efficiency of the antennas. Further degradation of the performance and efficiency of the antennas may result from proximity of the antennas to certain components (e.g., battery, metal plate), which can interfere with the electric signals on the antennas.

SUMMARY

This document describes a dual-antenna system for a video-recording doorbell, and associated devices and systems. The described antenna system may be implemented on an elongated printed circuit board and can be used for wideband and ultra-wideband applications. For low-cost devices, the dual-antenna system may implement diversity antennas by including first and second substantially orthogonal antennas connected to a chipset configured for single-input single-output (SISO) functionality. Depending on the propagation condition of each antenna and a position of the device (e.g., video-recording doorbell) relative to an access point, the device can select to use the antenna with the more-stable link. Although some devices use a decoupling structure between the two antennas to increase the antenna isolation, the dual-antenna system described herein achieves high isolation without a decoupling structure between the first and second antennas. Further, the dual-antenna system achieves high isolation while in proximity to a battery (e.g., a battery within a housing of a battery-powered, video-recording doorbell) and a metal plate (e.g., mounted to a rear side of the video-recording doorbell) for mounting the device to a wall or other structure.

In some aspects, a dual-antenna system for a video-recording doorbell is disclosed. The dual-antenna system may include a printed circuit board (PCB), a first antenna, and a second antenna. The PCB has an elongated shape with one end having a mechanical switch for receiving user input to trigger a function. The first antenna is printed on the PCB at a first location proximate to the one end of the PCB. The first antenna has a first element and a second element. The first element has a first arm configured for tuning a first frequency, and the first arm is capacitively coupled to the second element. The second element includes a second arm configured for tuning a second frequency that is different than the first frequency. The second antenna is printed on the PCB at a second location proximate to the one end of the PCB. In addition, the second antenna includes a third arm configured for tuning the first frequency and a fourth arm configured for tuning the second frequency. The third arm includes a first portion positioned to overlap a battery of the video-recording doorbell and a second portion positioned to not overlap the battery. The fourth arm is positioned to overlap the battery.

In other aspects, an electronic device that may include a dual-antenna system is disclosed. The electronic device includes a housing, a user-control button, a camera, a battery, and the dual-antenna system. The housing may be generally obround in front view and includes a longitudinal axis intersecting first and second opposing ends of the housing. The camera is positioned proximate to the first end of the housing. The user-control button is positioned proximate to the second end of the housing. The battery is positioned within the housing between the first and second ends. The dual-antenna system is positioned proximate to the second end of the housing. The dual-antenna system includes a first antenna and a second antenna. The first antenna has a first element and a second element, with the first element having a first arm configured for tuning a first frequency and being capacitively coupled to the second element. The second element includes a second arm configured for tuning a second frequency that is different than the first frequency. The second antenna includes a third arm configured for tuning the first frequency and a fourth arm configured for tuning the second frequency. The third arm includes a first portion positioned to overlap the battery and a second portion positioned to not overlap the battery. The fourth arm is positioned to overlap the battery. Also, the first element of the first antenna is positioned between the second antenna and the second element of the first antenna.

This summary is provided to introduce simplified concepts concerning a dual-antenna system for a video-recording doorbell, which is further described below in the Detailed Description and Drawings. This summary is not intended to identify essential features of the claimed subject matter, nor is it intended for use in determining the scope of the claimed subject matter.

BRIEF DESCRIPTION OF THE DRAWINGS

The details of one or more aspects of a dual-antenna system for a video-recording doorbell, and associated devices and systems, are described in this document with reference to the following drawings. The same numbers are used throughout the drawings to reference like features and components.

DETAILED DESCRIPTION

Overview

This document describes a dual-antenna system for a video-recording doorbell, and associated devices and systems in which a dual-antenna system for a video-recording doorbell may be implemented. This dual-antenna system has high isolation (e.g., greater than 20 decibels (dB)) between multiple antennas at multiple bands (e.g., 2.4 GHz and 5 GHz bands). The dual-antenna system includes two antennas positioned proximate to the same end of the video-recording doorbell without a decoupling structure between the two antennas. Using the dual-antenna system described herein, a low-cost battery-powered device having a small form factor (e.g., a video-recording doorbell) can utilize antenna diversity to achieve dual band functionality using two antennas in close proximity without a decoupling structure between them.

While features and concepts of the described dual-antenna system for a video-recording doorbell can be implemented in any number of different environments, aspects are described in the context of the following examples.

Example Device

Figure 1:
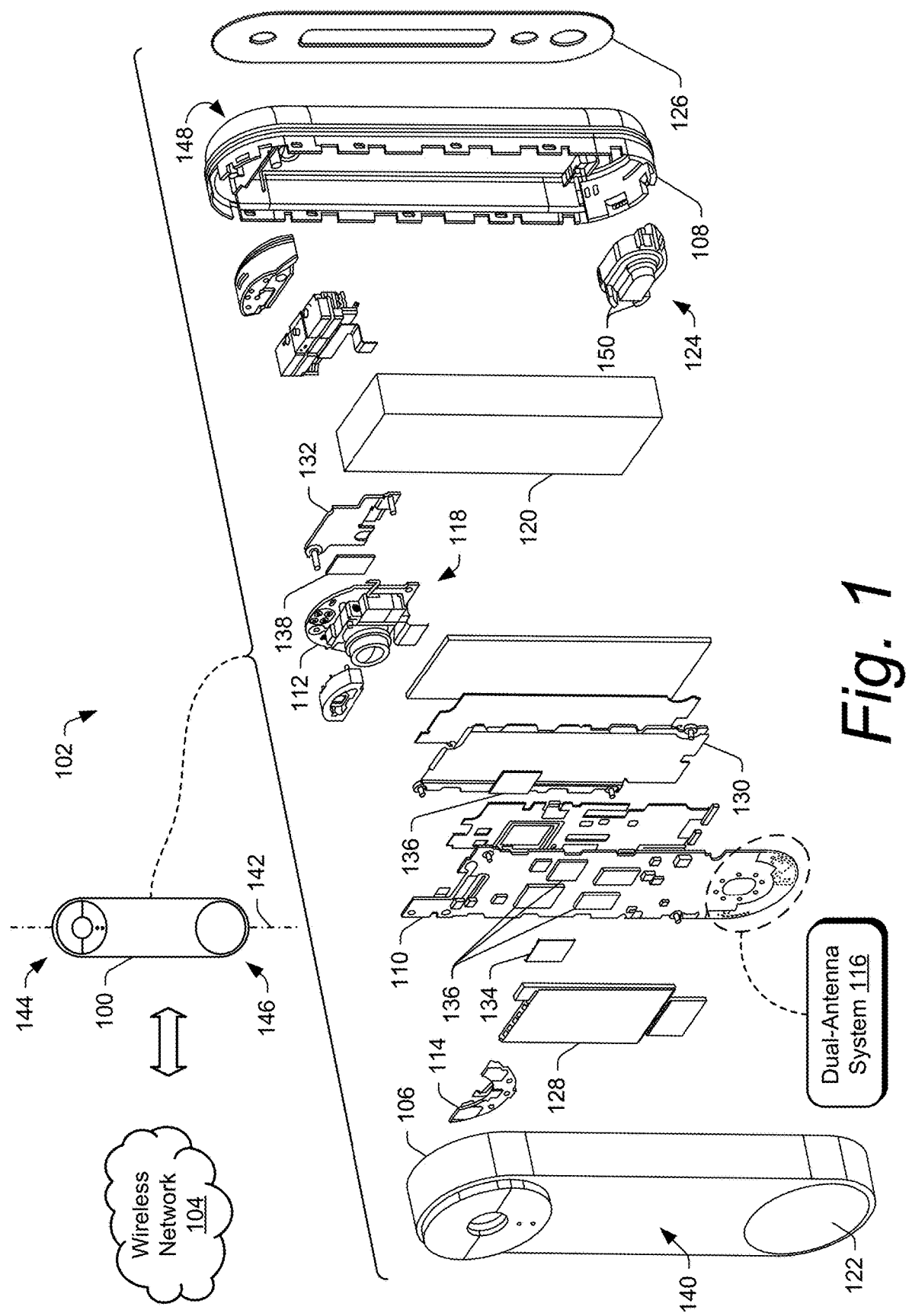
FIG. 1 illustrates an example electronic device, and an exploded view of some components thereof, in which a dual-antenna system for a video-recording doorbell may be implemented.

FIG. 1 illustrates an example electronic device 100 (e.g., a video-recording doorbell) and an exploded view 102 of some components thereof. The electronic device 100 may connect to a wireless network 104 (e.g., via a wireless router) and support a variety of functions, including capturing audio and/or video data (including images or streaming video), transmitting the captured data to online storage, storing the captured data to local memory, streaming audio (e.g., music, news, podcasts, sports), and interacting with a virtual assistant to perform tasks (e.g., search the internet, schedule events and alarms, control home automation, control internet-of-things (IoT) devices), and so on.

The electronic device 100 includes a housing formed by one or more housing members, including a front housing member 106 (e.g., a front cover) and a rear housing member 108 (e.g., a back component), and multiple printed circuit boards (PCBs) including at least PCB 110 (e.g., a main logic board), a camera board 112, and an infrared (IR) board 114. Additional PCBs may also be used. The PCBs may include various integrated circuit (IC) components, including system-on-chip (SoC) IC devices, processors, and IC components for light-emitting diode(s) (LEDs), microphone(s), or sensors for detecting input such as touch-input, a button-press, or a voice command. The electronic device 100 also includes a dual-antenna system 116, a camera subassembly 118 (e.g., a camera), a battery 120, a button 122, a speaker module 124, and a wallplate 126. In addition, the electronic device 100 may include a thermal-control system, which may include one or more heat spreaders (e.g., heat spreaders 128, 130, and 132) and one or more thermal interface materials (TIMs) (e.g., TIMs 134, 136, and 138) such as thermal gel, thermal paste, thermal adhesive, thermal tape) with high thermal conductivities. In some aspects, the heat spreader 128 may double as an electromagnetic interference (EMI) shield for SoC IC devices mounted on the PCB 110.

The housing members 106 and 108 may include a plastic material and be formed, for example, using plastic-injection molding techniques. The housing members 106 and 108 may include any suitable geometry, including the example geometry illustrated in FIG. 1. For instance, the front housing member 106 and the rear housing member 108 may form complementary portions of a shell (e.g., a hollow, substantially obround shell) that fit together (e.g., snap together) to form a cavity to house various components of the electronic device 100. In some implementations, the front housing member 106 and/or the rear housing member 108 may include multiple parts assembled together. The front housing member 106 may also include an aperture or transparent region that is aligned with the camera subassembly 118 to enable the camera subassembly 118 to view through the aperture or transparent region and capture images or video of a scene.

The button 122 include any suitable button (e.g., a mechanical button to open or close a switch, a capacitive sensor to detect user touch) usable to initiate a function. For example, actuation of the button 122 may initiate a function, including a ringing of an audible doorbell, transmission of an electronic notification to a smartphone of the doorbell's owner, initiation of the camera subassembly 118, and so on. Any suitable function can be initiated by activating the button 122.

The speaker module 124 may output audio waves toward a front and/or sides (e.g., lateral sides that are orthogonal to a front surface 140 of the front housing member 106) of the electronic device 100. The speaker module 124 can enable a visitor (e.g., a user pressing the button 122) to listen to an audible message, including a recorded audio message or a real-time audio transmission from the doorbell's owner.

The battery 120 provides power to the electronic device 100 and enables the electronic device 100 to be wireless. Because the electronic device 100 is battery powered, the electronic device 100 can be mounted in any suitable location, without having to hardwire the electronic device 100 to an electric power source. For example, the electronic device 100 (e.g., video-recording doorbell) can be mounted on a user's house proximate to their front door without having to drill holes in the house to connect wires to a power source inside the house.

The PCBs (e.g., the PCB 110, the camera board 112, the IR board 114) may be formed, for example, from glass-reinforced epoxy material such as FR4. In some instances, the PCBs may include a single layer of electrically conductive traces and be a single-layer board. In other instances, the PCBs may be a multi-layer board that includes multiple layers of electrically conductive traces that are separated by layers of a dielectric material.

As described herein, the housing of the electronic device 100 includes an elongated shape (e.g., substantially obround in front view) having a longitudinal axis 142 intersecting first and second opposing ends of the housing. The camera subassembly 118 is positioned proximate to the first end (e.g., a camera-side end 144) of the electronic device 100. The button 122 and the speaker module 124 are positioned proximate to the second end (e.g., a button-side end 146) of the housing. When the electronic device 100 is assembled, the battery 120 is positioned between the camera-side end 144 and the button-side end 146.

The dual-antenna system 116 may be mounted on a PCB (e.g., the PCB 110). For example, the dual-antenna system 116 may include conductive trace (e.g., copper) forming multiple (e.g., two) antennas. As such, the antennas of the dual-antenna system 116 may be printed on the PCB 110. The dual-antenna system 116 may be located proximate to the button-side end 146 of the electronic device 100. Positioning the dual-antenna system 116 at the button-side end 146 reduces negative effects on antenna efficiency caused by the camera subassembly 118. To reduce adverse effects of the wallplate 126 on the antenna performance and efficiency, the PCB 110 on which the dual-antenna system 116 resides is positioned proximate to the front housing member 106 such that the dual-antenna system 116 is positioned between the battery 120 and the front housing member 106. Accordingly, the battery 120 is located between the PCB 110 and the rear housing member 108, and the rear housing member 108 is positioned between the battery 120 and the wallplate 126. Accordingly, the wallplate 126 can be mounted to a rear exterior surface 148 of the rear housing member 108, where the rear exterior surface 148 is opposite the front surface 140 of the front housing member 106 when the rear housing member 108 is assembled to the front housing member 106.

Figure 2:
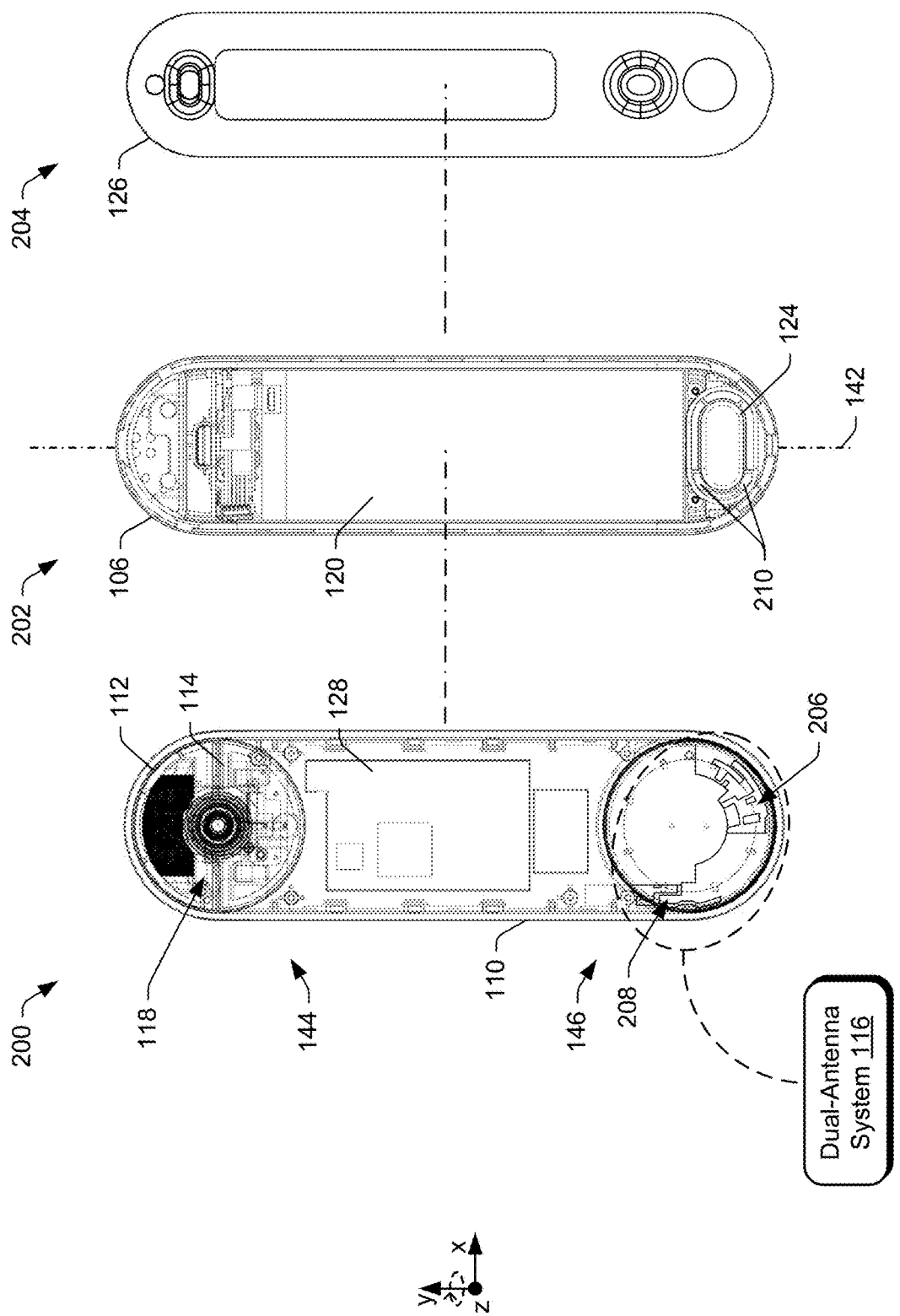
FIG. 2 illustrates different subassemblies of the electronic device of FIG. 1 in more detail.

FIG. 2 illustrates different subassemblies of the electronic device 100 of FIG. 1 in more detail. A first subassembly 200 includes the components of the electronic device 100 that are positioned between the battery 120 and the front housing member 106 (not shown in FIG. 2), as well as components positioned at the camera-side end 144 of the electronic device 100. For example, the first subassembly 200 includes at least the PCB 110, the camera subassembly 118, the camera board 112, the IR board 114, and the heat spreaders 128 and 130 (hidden under the PCB 110). In aspects, the PCB 110 includes an end, having a semi-elliptical shape, on which the dual-antenna system 116 is mounted.

A second subassembly 202 includes at least the rear housing member 108, the battery 120, and the speaker module 124. A third subassembly 204 includes the wallplate 126. The first, second, and third subassemblies 200, 202, and 204, respectively, are aligned horizontally in FIG. 2 to indicate a relative positioning in a y-direction (e.g., a direction parallel to the longitudinal axis 142). To vertically align the first, second, and third subassemblies 200, 202, and 204, respectively, about the longitudinal axis 142, the first subassembly 200 is placed in front of the second subassembly 202, which is placed in front of the third subassembly 204, such that the second and third subassemblies 202 and 204, respectively, become hidden behind the first subassembly 200. In this way, it can be seen that the dual-antenna system 116 is aligned with the speaker module 124.

The dual-antenna system 116 includes a first antenna 206 and a second antenna 208, which are approximately 90 degrees out of phase with one another, such that the two antennas are substantially orthogonal. This offset provides complimentary coverage and helps to provide pattern diversity and high isolation. The first and second antennas 206 and 208 are coplanar with the PCB 110 and are positioned, as a group, at the button-side end 146 of the electronic device 100. As illustrated in the second subassembly 202, the speaker module includes multiple electrical contacts 210, which are configured to be electrically connected to the PCB 110. Further detail of the dual-antenna system 116 is described below with respect to FIG. 3.

Figure 3:
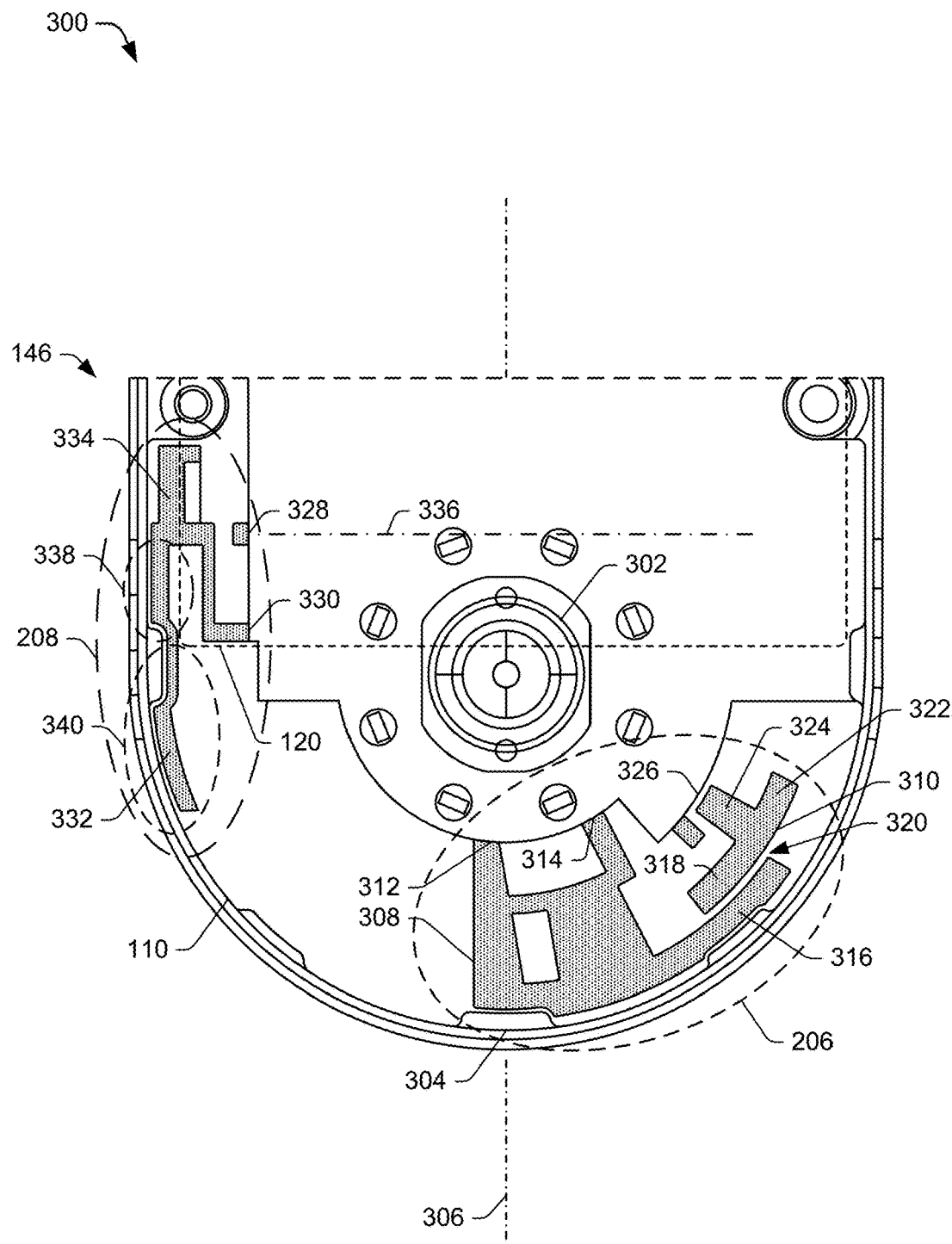
FIG. 3 illustrates an enlarged view of a portion of the PCB including the dual-antenna system of FIGS. 1 and 2 in more detail.

FIG. 3 illustrates an enlarged view 300 of a portion of the PCB 110 including the dual-antenna system 116 of FIGS. 1 and 2 in more detail. In the illustrated example, the first antenna 206 and the second antenna 208 are radially distributed about a switch mechanism 302 mounted on the PCB 110 (e.g., at the button-side end 146 of the PCB 110, which may have a semi-elliptical shape). The switch mechanism 302 includes a switch corresponding to a button (e.g., the button 122 on the front housing member 106 shown in FIG. 1). The first antenna 206 may be positioned proximate to a longitudinal end 304 (e.g., tip) of the PCB 110. In some aspects, the first antenna 206 may be intersected by a longitudinal axis 306 of the PCB 110. When the electronic device 100 is assembled, the longitudinal axis 306 of the PCB 110 may be aligned with (e.g., substantially parallel to) a direction of the longitudinal axis 146 (shown in FIG. 1) of the electronic device 100. The second antenna 208 may be positioned along a lateral side of the PCB 110 (e.g., a side of the PCB 110 that is substantially parallel to the longitudinal axis 306), such that the second antenna 208 is approximately 90 degrees out of phase with the first antenna 206.

The first antenna 206 may include any suitable structure that enables dual-band functionality. In the illustrated example, the first antenna 206 includes a first element 308 and a second element 310. The first element 308 of the first antenna 206 has a generally L-shaped structure. The second element 310 of the first antenna 206 has a generally T-shaped structure. The first element 308 includes a grounded connection 312 (e.g., "foot"). Optionally, the first element 308 also includes an additional grounded connection 314). The first element 308 extends, in relation to the switch mechanism 302 on the PCB 110, radially outward from the PCB 110. In addition, the first element 308 includes an arm 316, which is tunable to a first frequency (e.g., 2.4 GHz). The arm 316 is capacitively coupled to the second element 310 of the first antenna 206. For example, the arm 316 radially overlaps with an arm 318 of the second element 310 but does not physically contact the arm 318. Rather, the arms 316 and 318 are separated by a gap 320, which is usable to tune the first antenna 206 based on a width of the gap 320. For example, the gap 320 may be used as a tuning element to tune the 2.4 GHz frequency.

The second element 310 includes another arm 322 that extends in an opposite direction than that of the arm 318. The arm 322 is usable to tune a second frequency (e.g., 5 GHz). In aspects, the arm 322 has a length that is shorter than that of the arm 316, which enables the arm 322 to be used for higher frequencies and the arm 316 to be used for lower frequencies. In aspects, the arm 322 may also be shorter in length than the arm 318. The second element 310 includes a center post 324 of the "T" structure, which extends from the arms 318 and 322 toward the switch mechanism 302 and has a terminal 326. In some aspects, the terminal 326 may be implemented as a radio terminal used to deliver power to the first antenna 206 from a power source (not shown). For example, the second element 310 may be connected, via the terminal 326, to a chipset mounted on the PCB 110. The arms 316, 318, and 322 each form an arc that extends along a circumferential line concentric with an outer circumference of the PCB 110, in particular each of the arms 316, 318, and 322 may be concentric with the PCB 110.

The second antenna 208 may include any suitable structure that enables dual-band functionality. In the illustrated example, the second antenna 208 has a generally F-shaped structure and is oriented to be substantially aligned lengthwise with a direction of the longitudinal axis 306 of the PCB 110. For example, the second antenna 208 includes a feed terminal 328 (e.g., a radio terminal used to deliver power to the second antenna 208 from a power source (not shown)) and a ground connection 330. In addition, the second antenna 208 includes multiple arms (e.g., arm 332 and arm 334) extending in opposite directions that are substantially parallel to the longitudinal axis 306. In the illustrated example, the arm 332 extends downward (e.g., in a direction toward the longitudinal end 304 (e.g., tip) of the PCB 110) and the arm 334 extends upward (e.g., in a direction toward the camera-side end 144 shown in FIG. 2). The arm 332 has a length that is longer than that of the arm 334, such that the arm 332 is tunable to the first frequency (e.g., 2.4 GHz) and the arm 334 is tunable to the second frequency (e.g., 5 GHz).

In aspects, the feed terminal 328 of the second antenna 208 is positioned such that a line 336, drawn from the feed terminal 328 in a direction toward and orthogonal to the longitudinal axis 306 of the PCB 110, does not intersect the switch mechanism 302. Rather, the switch mechanism 302 is located between the line 336 and a longitudinal end 304 (e.g., tip) of the PCB 110. Such placement enables electric current to run orthogonally compared to that of the grounded connection 312 (or the additional grounded connection 314) of the first antenna 206, which enables the radiation patterns of the first and second antennas 206 and 208, respectively, to be approximately 90 degrees from each other.

To further increase antenna efficiency while still maintaining high isolation between the first and second antennas 206 and 208, the arm 332 is positioned to partially overlap (and not completely overlap) the battery 120, in order to reduce signal interference caused by the battery 120. For example, the arm 332 of the second antenna 208 includes a first portion 338 and a second portion 340. The first portion 338 overlaps lengthwise with the battery 120 (in the y-direction). The second portion 340, however, does not overlap the battery 120 in any of the x, y, or z directions. Notice that the arm 334 (e.g., the smaller arm) overlaps lengthwise with the battery 120 but extends widthwise (e.g., in the x-direction) beyond an edge of the battery 120. In this way, the first portion 338 of the arm 332 is positioned to not overlap widthwise (e.g., in the x-direction) with the battery 120. Such placement of the different parts of the second antenna 208 relative to the battery 120 may reduce signal interference caused by the battery 120 and enable the radiation pattern of the second antenna 208 to reach around the side of the battery 120.

Returning to FIG. 2, when the electronic device 100 is assembled, the dual-antenna system 116 is positioned directly in front of the speaker module 124. In this way, and as shown in FIG. 1, the dual-antenna system 116 is positioned between the speaker module 124 and the button 122. For operation and control of the speaker module 124, the speaker module 124 is electrically connected to the PCB 110, e.g., via the electrical contacts 210. Some assembly methods may electrically connect the speaker module 124 to the PCB 110 by soldering wires to the speaker path, plucking the wires into the PCB 110, and then placing the speaker module 124 and the PCB 110 in close proximity for assembly within the housing of the electronic device 100. This assembly method results in a significantly longer electrical path than an actual distance between the speaker module 124 and the PCB 110 in the assembly, which may affect the antenna isolation. To improve the antenna isolation, a shorter electrical path may be implemented, which is described in more detail below.

Figure 4:
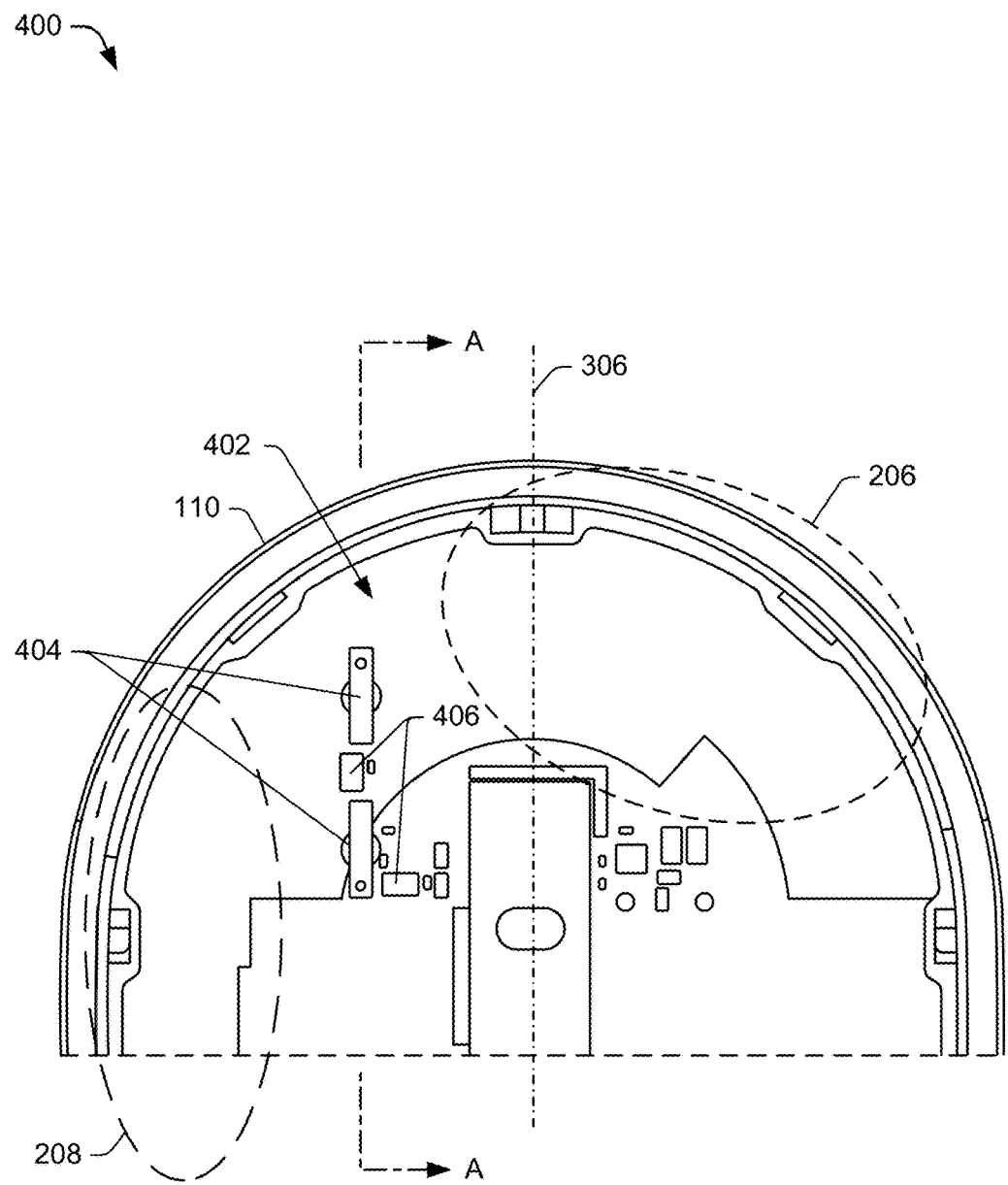
FIG. 4 illustrates a zoomed-in view of a surface of the PCB that faces the speaker module from FIG. 1.

Consider FIG. 4, which illustrates a zoomed-in view 400 of a surface 402 of the PCB 110 that faces the speaker module 124 from FIG. 1. In aspects, the surface 402 of the PCB 110 is opposite a second surface of the PCB 110 that faces the button 122 (shown in FIGS. 1-3). As illustrated, electrical connectors 404 may be implemented to create an electrical path that is substantially similar (e.g., approximately the same length) as the distance between the speaker module 124 and the PCB 110, provided a tolerance on the order of approximately two millimeters. For low-cost implementations, the electrical connectors 404 may include spring clips, which are connected to the PCB 110 at one or more locations between the first and second antennas 206 and 208, which are indicated by dashed lines showing approximate locations of the first and second antennas 206 and 208, respectively, positioned on the second surface of the PCB 110, which is hidden in FIG. 4 but shown in FIGS. 1-3). Spring clips (or other electrical connectors) may be mounted to the PCB 110 using any suitable mounting technique, including surface-mount technology (SMT) methods. The spring clips are mounted on an opposite side of the PCB 110 from the dual-antenna system 116. When the PCB 110 is aligned with and placed in proximity to the speaker module 124, the spring clip interfaces with (e.g., abuts) electrical contacts on the speaker module 124 to form an electrical connection. In some implementations, however, the spring clips may be mounted to the speaker module 124 and configured to interface with an electrical contact on the PCB 110. Although spring clips are described herein, any suitable connector may be used to create the electrical path, including a pin connector (e.g., pogo pin) or a wire connector.

To further control and reduce the length of the electrical path between the PCB 110 and the speaker module 124, the speaker module 124 includes one or more raised areas (e.g., pedestals 150 in FIG. 1) extending toward the PCB 110. An open end of the raised area (e.g., a surface of the pedestal 150 that faces the PCB 110) may include an electrical contact (e.g., the electrical contacts 210 in FIG. 2) that interfaces with the connector 404 (e.g., spring clip) mounted on the PCB 110. The raised area decreases the distance between the electrical contacts 210 and the PCB 110.

In addition, to choke off adverse electrical effects to the first and second antennas 206 and 208 caused by the speaker module 124, one or more chokes 406 (e.g., inductors) may be placed on the PCB 110 in series with the connectors 404 on the PCB 110. Notice that the chokes 406 are located in close proximity to the connectors 404. This close proximity of the chokes 406 to the connectors 404 helps improve the antenna efficiency and isolation. In implementations, at least one choke 406 is positioned between the two connectors 404 and another choke 406 is positioned between a connector 404 and the longitudinal axis 306 of the PCB 110. In one implementation, the connectors 404 and chokes 406 are arranged together in a substantially L-shaped formation, which extends outward from the longitudinal axis 306 of the PCB 110 in a first direction that is substantially orthogonal to the longitudinal axis 306 and then extends in a second direction that is substantially parallel to the longitudinal axis 306. The connectors 404 and chokes 406 may be arranged in any suitable arrangement relative to one another and the longitudinal axis 306 of the PCB 110, including, e.g., a generally T-shaped arrangement, a generally F-shaped arrangement.

Figure 5:
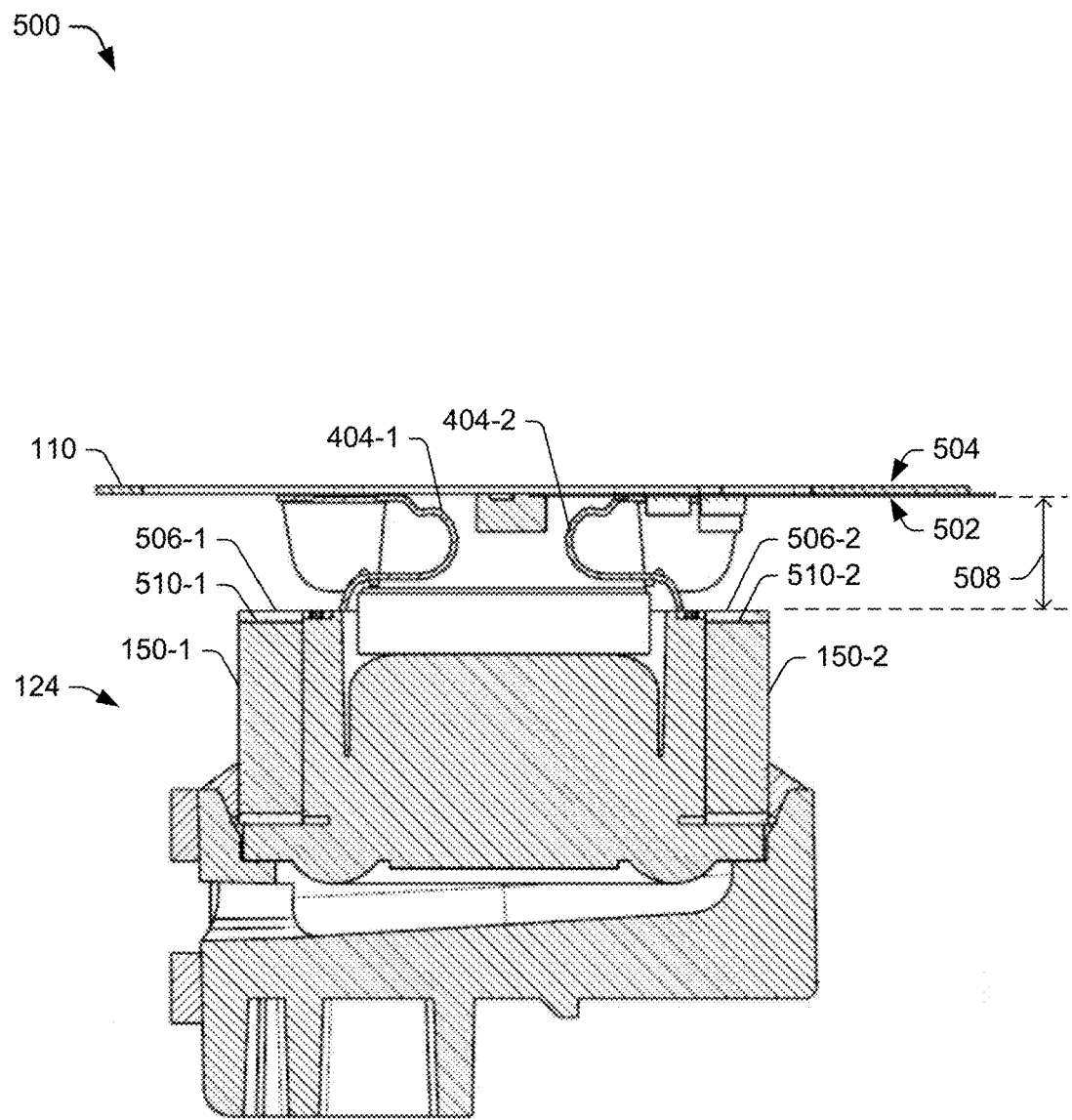
FIG. 5 illustrates a sectional view of the PCB from FIG. 4, taken along line A-A, including the speaker module and the connectors.

FIG. 5 illustrates a sectional view 500 of the PCB 110 from FIG. 4, taken along line A-A, and including the speaker module 124 and the connectors 404. In the illustrated example, the connectors 404 are implemented as spring clips 404-1 and 404-2. The spring clips 404-1 and 404-2 are mounted to a first surface 502 of the PCB 110, which is opposite a second surface 504 on which the dual-antenna system 116 (shown in FIGS. 1-3) is mounted. The speaker module 124 includes conductive surfaces (e.g., electrical contacts 506-1 and 506-2) for electrically connecting the speaker module 124 to the connectors 404 (e.g., the spring clips 404-1 and 404-2). To reduce a distance 508 between the PCB 110 and the electrical contacts 506-1 and 506-2, the speaker module 124 includes pedestals 150-1 and 150-2, which are instances of the pedestals 150 in FIG. 1. The pedestals 150-1 and 150-2 extend from the speaker module 124 toward the PCB 110. Each of the pedestals 150-1 and 150-2 have an open end 510 (e.g., open ends 510-1 and 510-2, respectively) on which one of the electrical contacts 210 is located. Using the pedestals 150-1 and 150-2, the distance 508 can be finely controlled to reduce the electrical path between the speaker module 124 and the PCB 110, and consequently reduce the resistance along the electrical path.

Example Computing System

Figure 6:
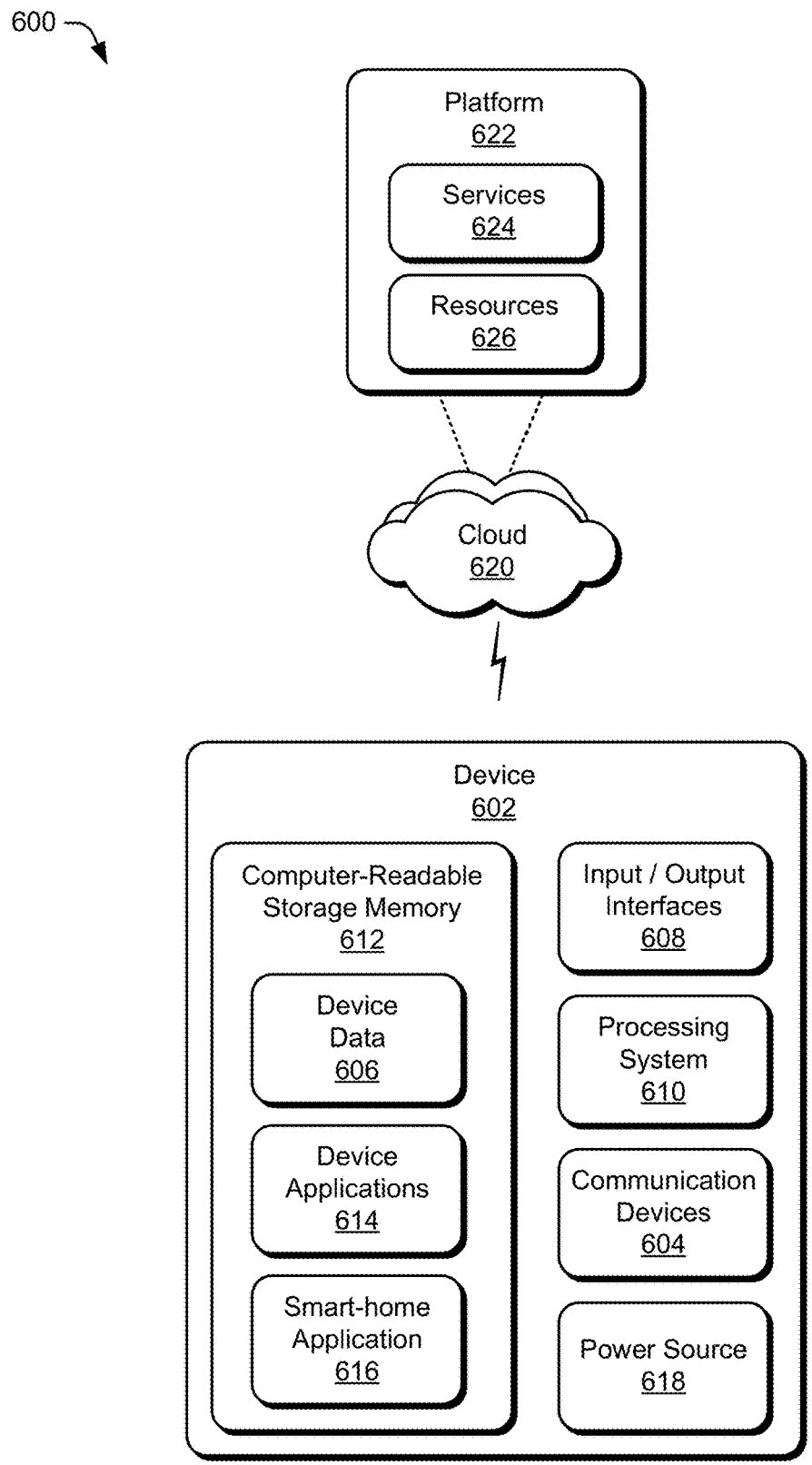
FIG. 6 is a block diagram illustrating an example system that includes an example device, which can be implemented as any electronic device that implements aspects of the dual-antenna system as described with reference to the previous FIGS. 1-5.

FIG. 6 is a block diagram illustrating an example system 600 that includes an example device 602, which can be implemented as any electronic device (e.g., the electronic device 100) that implements aspects of the dual-antenna system 116 as described with reference to the previous FIGS. 1-5. The example device 602 may be any type of computing device, client device, mobile phone, tablet, communication, entertainment, gaming, media playback, and/or other type of device. Further, the example device 602 may be implemented as any other type of electronic device that is configured for communication on a network, such as a thermostat, hazard detector, camera, light unit, commissioning device, router, border router, joiner router, joining device, end device, leader, access point, a hub, and/or other electronic devices. The example device 602 can be integrated with electronic circuitry, microprocessors, memory, input output (I/O) logic control, communication interfaces and components, as well as other hardware, firmware, and/or software to communicate via the network. Further, the device 602 can be implemented with various components, such as with any number and combination of different components as further described below.

The device 602 includes communication devices 604 that enable wired and/or wireless communication of device data 606, such as data that is communicated between the devices in a network, data that is being received, data scheduled for broadcast, data packets of the data, data that is synched between the devices, etc. The device data can include any type of communication data, as well as audio, video, and/or image data that is generated by applications executing on the device. The communication devices 604 can also include transceivers for cellular phone communication and/or for network data communication. The communication devices 604 can include wireless radio systems for multiple, different wireless communications systems. The wireless radio systems may include Wi-Fi, Bluetooth™, Mobile Broadband, Bluetooth Low Energy (BLE), and/or point-to-point IEEE 802.15.4. Each of the different radio systems can include a radio device, antenna, and chipset that is implemented for a particular wireless communications technology.

The device 602 also includes input/output (I/O) interfaces 608, such as data network interfaces that provide connection and/or communication links between the device, data networks (e.g., an internal network, external network, etc.), and other devices. The I/O interfaces can be used to couple the device to any type of components, peripherals, and/or accessory devices. The I/O interfaces also include data input ports via which any type of data, media content, and/or inputs can be received, such as user inputs to the device, as well as any type of communication data, such as audio, video, and/or image data received from any content and/or data source.

The device 602 includes a processing system 610 that may be implemented at least partially in hardware, such as with any type of microprocessors, controllers, or the like that process executable instructions. The processing system can include components of an integrated circuit, programmable logic device, a logic device formed using one or more semiconductors, and other implementations in silicon and/or hardware, such as a processor and memory system implemented as a system-on-chip (SoC). Alternatively or in addition, the device can be implemented with any one or combination of software, hardware, firmware, or fixed logic circuitry that may be implemented with processing and control circuits. The device 602 may further include any type of a system bus or other data and command transfer system that couples the various components within the device. A system bus can include any one or combination of different bus structures and architectures, as well as control and data lines.

The device 602 also includes computer-readable storage memory 606, such as data storage devices that can be accessed by a computing device, and that provide persistent storage of data and executable instructions (e.g., software applications, modules, programs, functions, or the like). The computer-readable storage memory described herein excludes propagating signals. Examples of computer-readable storage memory include volatile memory and non-volatile memory, fixed and removable media devices, and any suitable memory device or electronic data storage that maintains data for computing device access. The computer-readable storage memory can include various implementations of random access memory (RAM), read-only memory (ROM), flash memory, and other types of storage memory in various memory device configurations.

The computer-readable storage memory 606 provides storage of the device data 606 and various device applications 614, such as an operating system that is maintained as a software application with the computer-readable storage memory and executed by the processing system 610. The device applications may also include a device manager, such as any form of a control application, software application, signal processing and control module, code that is native to a particular device, a hardware abstraction layer for a particular device, and so on. In this example, the device applications also include a smart-home application 616 that implements aspects of the dual-antenna system 116, such as when the example device 602 is implemented as any of the electronic devices described herein. The device 602 also includes a power source 618, such as the battery 120. An alternating current (AC) power source may also be used to charge the battery of the device.

In aspects, at least part of the techniques described for the dual-antenna system 116 may be implemented in a distributed system, such as over a "cloud" 620 in a platform 622. The cloud 620 includes and/or is representative of the platform 622 for services 624 and/or resources 626.

The platform 622 abstracts underlying functionality of hardware, such as server devices (e.g., included in the services 624) and/or software resources (e.g., included as the resources 626), and communicatively connects the example device 602 with other devices, servers, etc. The resources 626 may also include applications and/or data that can be utilized while computer processing is executed on servers that are remote from the example device 602. Additionally, the services 624 and/or the resources 626 may facilitate subscriber network services, such as over the Internet, a cellular network, or Wi-Fi network. The platform 622 may also serve to abstract and scale resources to service a demand for the resources 626 that are implemented via the platform, such as in an interconnected device implementation with functionality distributed throughout the system 600. For example, the functionality may be implemented in part at the example device 602 as well as via the platform 622 that abstracts the functionality of the cloud 620.

CONCLUSION

Although aspects of the dual-antenna system have been described in language specific to features and/or methods, the subject of the appended claims is not necessarily limited to the specific features or methods described. Rather, the specific features and methods are disclosed as example implementations of the claimed dual-antenna system or a corresponding electronic device, and other equivalent features and methods are intended to be within the scope of the appended claims. Further, various different aspects are described, and it is to be appreciated that each described aspect can be implemented independently or in connection with one or more other described aspects.

What is claimed is:

1. A dual-antenna system for an electronic device, the dual-antenna system comprising:
   a first antenna printed on a printed circuit board (PCB) at a first location proximate to the one end of the PCB, the first antenna having a first element and a second element, the first element having a first arm configured for tuning a first frequency, the first arm capacitively coupled to the second element, the second element including a second arm configured for tuning a second frequency that is different than the first frequency; and
   a second antenna printed on the PCB at a second location proximate to the one end of the PCB, the second antenna including a third arm configured for tuning the first frequency and a fourth arm configured for tuning the second frequency, the third arm positioned to partially overlap a battery of the electronic device.

2. The dual-antenna system of claim 1, wherein the first element is positioned between the second element and the second antenna.

3. The dual-antenna system of claim 1, wherein the first antenna is approximately 90 degrees out of phase with the second antenna.

4. The dual-antenna system of claim 1, wherein the first arm is separated from the second element by a gap usable to tune the first antenna based on a width of the gap.

5. The dual-antenna system of claim 1, wherein the second element is connected to a chipset mounted on the PCB.

6. The dual-antenna system of claim 1, wherein the first antenna does not overlap the battery in a direction that is orthogonal to a long axis of the PCB.

7. The dual-antenna system of claim 1, wherein the first element of the first antenna has a generally L-shaped structure, and the second element of the first antenna has a generally T-shaped structure.

8. The dual-antenna system of claim 1, wherein:
   the one end of the PCB has a semi-elliptical shape; and
   the first antenna and the second antenna are radially distributed about a mechanical switch configured to receive a user input to trigger a function.

9. The dual-antenna system of claim 1, wherein:
   the PCB includes one or more electrical connectors configured to electrically connect the PCB to a speaker module of the video-recording doorbell; and
   the one or more electrical connectors are mounted on an opposing side of the PCB from the first and second antennas and at a location that is between the first and second antennas.

10. The dual-antenna system of claim 9, wherein the one or more electrical connectors include at least one of a spring clip, a pin connector, or a wire connector.

11. An electronic device comprising:
   a housing that is elongated along a longitudinal axis that intersects first and second opposing ends of the housing;
   a camera positioned proximate to the first end of the housing;
   a user-control button positioned proximate to the second end of the housing;
   a battery positioned within the housing between the first and second ends; and
   a dual-antenna system positioned proximate to the second end of the housing, the dual-antenna system including:
   a first antenna having a first element and a second element, the first element having a first arm configured for tuning a first frequency, the first arm capacitively coupled to the second element, the second element including a second arm configured for tuning a second frequency that is different than the first frequency; and
   a second antenna including a third arm configured for tuning the first frequency and a fourth arm configured for tuning the second frequency, the third arm positioned to partially overlap the battery.

12. The electronic device of claim 11, wherein the first and second antennas are printed on a printed circuit board (PCB).

13. The electronic device of claim 12, wherein the first and second antennas are radially distributed about a switch that is mounted on the PCB and that corresponds to the user-control button.

14. The electronic device of claim 12, further comprising:
   a speaker positioned within the housing and proximate to the second end of the housing; and
   one or more connectors configured to electrically connect the PCB to the speaker.

15. The electronic device of claim 14, wherein the one or more connectors include a spring clip.

16. The electronic device of claim 14, wherein the speaker includes one or more raised areas having electrical contacts, the one or more raised areas extending toward the PCB to decrease a distance between the electrical contacts and the PCB.

17. The electronic device of claim 14, wherein the one or more connectors are positioned between the second antenna and the first element of the first antenna.

18. The electronic device of claim 14, wherein:
   the first element of the first antenna has a generally L-shaped structure;
   the second element has a generally T-shaped structure; and
   the second antenna has a generally F-shaped structure.

19. The electronic device of claim 14, wherein the second antenna is oriented to be substantially aligned lengthwise with a direction of the longitudinal axis of the housing.

20. The electronic device of claim 14, wherein the first antenna and the second antenna are configured to achieve isolation of less than −20 dB without a decoupler between the first and second antennas.

* * * * *